(12) United States Patent
Park et al.

(10) Patent No.: US 10,795,262 B2
(45) Date of Patent: Oct. 6, 2020

(54) METHOD OF MANUFACTURING INTEGRATED CIRCUIT DEVICE

(71) Applicant: Samsung Electronics Co., Ltd., Suwon-si, Gyeonggi-do (KR)

(72) Inventors: Jin Park, Yongin-si (KR); Sang Ki Nam, Seongnam-si (KR); Kyu-hee Han, Seongnam-si (KR); Jin-ok Kim, Busan (KR); Jin-hong Park, Hwaseong-si (KR); Gwang-we Yoo, Suwon-si (KR)

(73) Assignees: SAMSUNG ELECTRONICS CO., LTD., Suwon-si, Gyeonggi-do (KR); Research & Business Foundation SUNGYUNKWAN UNIVERSITY, Suwon, Gyeonggi-do (KR)

( * ) Notice: Subject to any disclaimer, the term of this patent is extended or adjusted under 35 U.S.C. 154(b) by 91 days.

(21) Appl. No.: 16/165,567

(22) Filed: Oct. 19, 2018

(65) Prior Publication Data

US 2019/0287792 A1 Sep. 19, 2019

(30) Foreign Application Priority Data

Mar. 16, 2018 (KR) .......................... 10-2018-0031102

(51) Int. Cl.
*G03F 7/11* (2006.01)
*H01L 21/027* (2006.01)
(Continued)

(52) U.S. Cl.
CPC .................. *G03F 7/11* (2013.01); *G03F 7/16* (2013.01); *G03F 7/2004* (2013.01);
(Continued)

(58) Field of Classification Search
CPC ........................................................ G03F 7/38
See application file for complete search history.

(56) References Cited

U.S. PATENT DOCUMENTS 6,841,342 B2 1/2005 Nishi et al.
7,402,782 B2 7/2008 Iwaki
(Continued)

FOREIGN PATENT DOCUMENTS

JP 2006-030506 A 2/2006
KR 10-2014-0089854 A 7/2014

OTHER PUBLICATIONS

Yongsuk Choi, et al., Low-Voltage Complementary Electronics from Ion-Gel-Gated Vertical Van Der Waals Heterostructures, Advanced Materials, www.advmat.de, 2016, 28, pp. 3742-3748.
(Continued)

*Primary Examiner* — Kathleen Duda
(74) *Attorney, Agent, or Firm* — Lee IP Law, P.C.

(57) ABSTRACT

A method of manufacturing an integrated circuit (IC) device includes exposing a partial region of a photoresist film formed on a main surface of a substrate to generate acid, and diffusing the acid in the partial region of the photoresist film. Diffusing the acid may include applying an electric field, in a direction perpendicular to a direction in which the main surface of the substrate extends, to the photoresist film using an electrode facing the substrate through an electric-field transmission layer filling between the photoresist film and the electrode. The electric-field transmission layer may include an ion-containing layer or a conductive polymer layer.

13 Claims, 9 Drawing Sheets

(51) Int. Cl.
*G03F 7/16* (2006.01)
*G03F 7/32* (2006.01)
*G03F 7/20* (2006.01)
*G03F 7/38* (2006.01)

(52) U.S. Cl.
CPC ............ *G03F 7/2006* (2013.01); *G03F 7/322* (2013.01); *G03F 7/38* (2013.01); *H01L 21/0273* (2013.01)

(56) References Cited

U.S. PATENT DOCUMENTS

| | | |
|---|---|---|
| 8,586,269 B2 | 11/2013 | Okoroanyanwu et al. |
| 9,280,070 B2 | 3/2016 | Xie et al. |
| 9,366,966 B2 | 6/2016 | Xie et al. |
| 9,377,692 B2 | 6/2016 | Xie et al. |
| 9,798,240 B2 | 10/2017 | Xie et al. |
| 9,823,570 B2 | 11/2017 | Godet et al. |
| 9,829,790 B2 | 11/2017 | Buchberger, Jr. et al. |
| 2017/0184976 A1 | 6/2017 | Ouyang et al. |

OTHER PUBLICATIONS

Kihyon Hong, et al., Self-Supporting Ion Gels for Electrochemiluminescent Sticker-Type Optelectronic Devices, Scientific reports, www.nature.com/scientificreports, 6:29805; DOI; 10.1038, pp. 1-7.

METHOD OF MANUFACTURING INTEGRATED CIRCUIT DEVICE

CROSS-REFERENCE TO RELATED APPLICATION

Korean Patent Application No. 10-2018-0031102, filed on Mar. 16, 2018, in the Korean Intellectual Property Office, and entitled: "Method of Manufacturing Integrated Circuit Device," is incorporated by reference herein in its entirety.

BACKGROUND

1. Field

Embodiments relate to a method of manufacturing an integrated circuit (IC) device, and more particularly, to a method of manufacturing an IC device using an electric field.

2. Description of the Related Art

As the downscaling and high integration of IC devices have rapidly progressed, a new technique capable of ensuring the dimension precision of a pattern to be formed is needed when the pattern is formed using a photolithography process. In particular, with a reduction of the design rule of IC devices, techniques for improving critical dimension (CD) uniformity and increasing productivity using a simplified process in a photolithography process for forming a plurality of patterns arranged at fine pitches at a high density are being developed.

SUMMARY

One or more embodiments are directed to a method of manufacturing an IC device. The method includes forming a photoresist film including a photoacid generator (PAG) on a main surface of a substrate. A first region of the photoresist film is exposed to generate acid in the first region. The acid in the first region of the photoresist film may be diffused by applying an electric field, in a direction perpendicular to a direction in which the main surface of the substrate extends, to the photoresist film through an electric-field transmission layer between the photoresist film and an electrode facing the main surface of the substrate. The electric-field transmission layer may include an ion-containing layer or a conductive polymer layer.

One or more embodiments are directed a method of manufacturing an IC device. The method includes preparing a first electrode, a second electrode, and a power source connected to the first electrode and the second electrode, the power source to apply an electric field between the first electrode and the second electrode. A photoresist film maybe formed on a main surface of a substrate, the photoresist film including a photoacid generator (PAG). A first region of the photoresist film to generate acid in the first region of the photoresist film. The substrate may be arranged such that the photoresist film faces the first electrode with an electric-field transmission layer including an ion-containing layer therebetween. The acid in the first region of the photoresist film may be diffused by applying an electric field, in a direction perpendicular to a direction in which the main surface of the substrate extends, to the photoresist film through the electric-field transmission layer. A photoresist pattern may be formed by developing the photoresist film.

One or more embodiments are directed a method of manufacturing an IC device. The method may include preparing a first electrode, a second electrode, and a power source connected to the first electrode and the second electrode, the power source to apply an electric field between the first electrode and the second electrode. A photoresist film including a photoacid generator (PAG) may be formed on a main surface of a substrate. An electric-field transmission layer may be formed on the photoresist film, the electric-field transmission layer including a conductive polymer layer. A first region of the photoresist film may be exposed through the electric-field transmission layer to generate acid in the first region of the photoresist film. The substrate may be arranged such that the photoresist film faces the first electrode with the electric-field transmission layer therebetween. The acid in the first region of the photoresist film may be diffused by applying an electric field, in a direction perpendicular to a direction in which the main surface of the substrate extends, to the photoresist film through the electric-field transmission layer. A photoresist pattern may be formed by developing the photoresist film.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
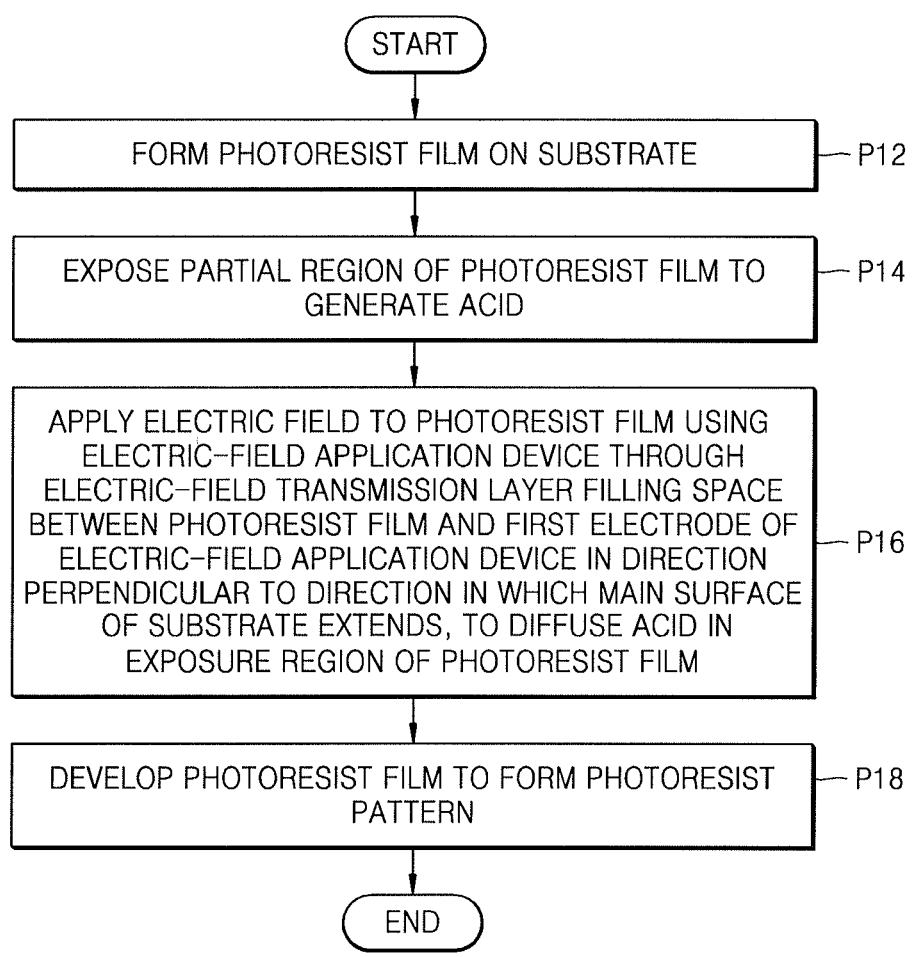
FIG. 1 illustrates a flowchart of a method of manufacturing an integrated circuit (IC) device, according to embodiments.

FIG. 1 is a flowchart of a method of manufacturing an integrated circuit (IC) device, according to embodiments. FIGS. 2A to 2D are cross-sectional views of sequential stages in a method of manufacturing an IC device, according to embodiments. The method of manufacturing the IC device, according to the embodiments, will be described with reference to FIGS. 1 and 2A to 2D.

Figure 2A:
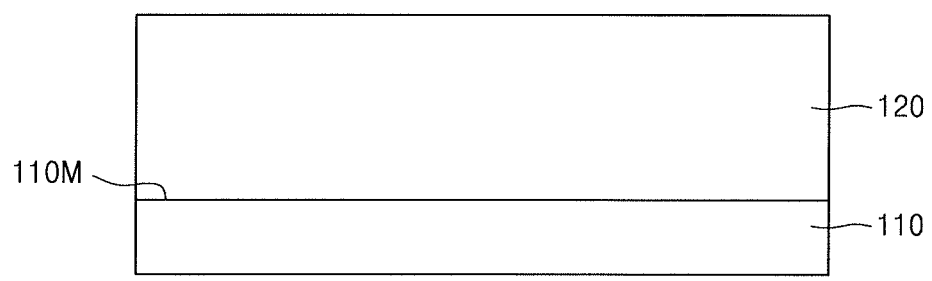
FIGS. 2A to 2D illustrate cross-sectional views of sequential stages in a method of manufacturing an IC device, according to embodiments.

Referring to FIGS. 1 and 2A, in process P12, a photoresist film 120 may be formed on a substrate 110. The substrate 110 may have a main surface 110M and the photoresist film 120 may be formed on the main surface 110M of the substrate 110. The substrate 110 may include a single layer including a single material or a multilayered structure including a plurality of different materials. The multilayered structure may include a semiconductor layer, an insulating layer, a conductive layer, or a combination thereof.

The main surface 110M of the substrate 110 may include a film to be processed and the photoresist film 120 may be formed on the film to be processed. In some embodiments, the film to be processed may include a region to be etched, a region to be implanted with ions, a region to be chemically or physically modified, and so forth. In some embodiments, an anti-reflection layer (ARL) may be formed between the substrate 110 and the photoresist film 120.

In some embodiments, the film to be processed may be a semiconductor substrate. In some other embodiments, the film to be processed may include a conductive film, a dielectric film, an insulating film, or a combination thereof, which may be formed on the semiconductor substrate. For example, the film to be processed may include a metal, an alloy, a metal carbide, a metal nitride, a metal oxynitride, a metal oxycarbide, a semiconductor, polysilicon (poly-Si), an oxide, a nitride, an oxynitride, or a combination thereof.

In some embodiments, to form the photoresist film 120, the substrate 110 may be coated with a photoresist composition including a photosensitive polymer, a photoacid generator (PAG), and a solvent. The coating of the photoresist composition may be performed using a spin coating process, a spray coating process, a deep coating process, and so forth.

The photoresist film 120 may be obtained from a positive-type photoresist material. The photoresist film 120 may include a polymer of which polarity is increased by action of acid. For example, the photoresist film 120 may include a polymer including an acid-labile protecting group and chemically amplified photoresist including a PAG.

In some embodiments, the photoresist film 120 may include 248-nm krypton fluoride (KrF) excimer laser resist, 193-nm argon fluoride (ArF) excimer laser resist, 157-nm $F_2$ excimer laser resist, 13.5-nm extreme ultraviolet (EUV) resist, and so forth.

For example, the photoresist film 120 may include a (meth)acrylate-based polymer. The (meth)acrylate-based polymer may be an aliphatic (meth)acrylate-based polymer. For example, the (meth)acrylate-based polymer may include polymethyl methacrylate (PMMA), poly(tert-butyl methacrylate), poly(methacrylic acid), poly(norbornyl methacrylate), a binary or ternary copolymer of repeating units of the (meth)acrylate-based polymers, or a combination thereof. Also, the above-described polymers may have structures that are substituted with various kinds of acid-labile protecting groups. The acid-labile protecting group may be selected from tert-butoxycarbonyl (t-BOC), isonorbornyl, 2-methyl-2-adamantyl, 2-ethyl-2-adamantyl, 3-tetrahydrofuranyl, 3-oxocyclohexyl, γ-butyllactone-3-yl, mavalonic-lactone, γ-butyrolactone-2-yl, 3-methyl-γ-butyrolactone-3-yl, 2-tetrahydropyranyl, 2-tetrahydrofuranyl, 2,3-propylenecarbonate-1-yl, 1-methoxyethyl, 1-ethoxyethyl, 1-(2-methoxyethoxy)ethyl, 1-(2-acetoxyethoxy)ethyl, t-ethoxycarbonylmethyl, methoxymethyl, ethoxymethyl, trimethoxysilyl, triethoxysilyl, and so forth.

Figure 2B:
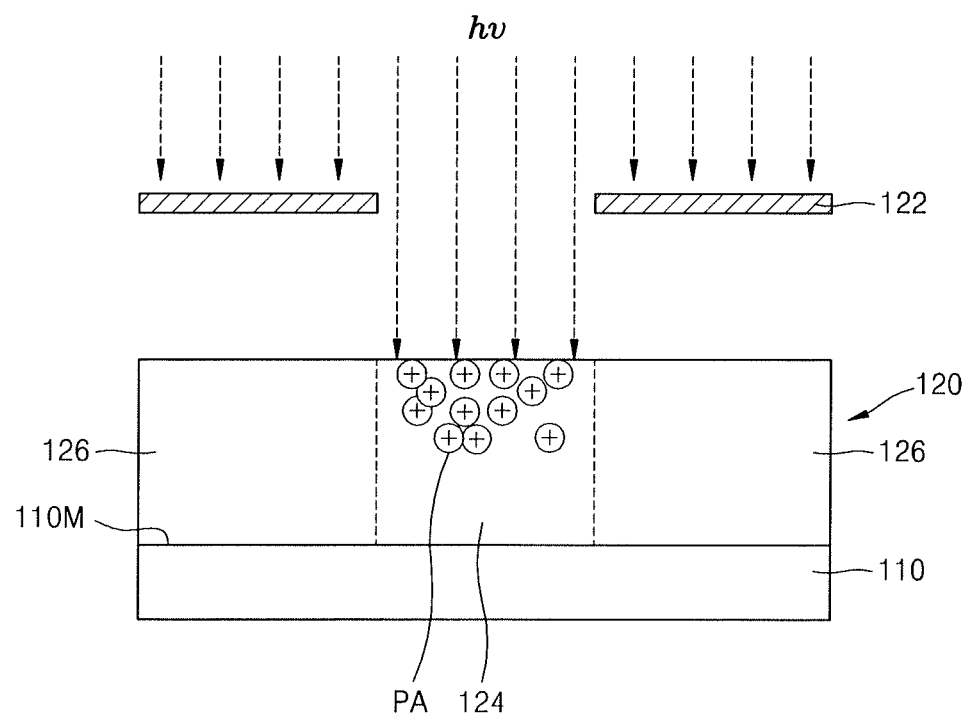

Referring to FIGS. 1 and 2B, in process P14, a partial region of the photoresist film 120 may be exposed so that acid PA may be generated from the photoresist film 120. To expose the partial region of the photoresist film 120, light may be irradiated through a photomask 122 onto the partial region of the photoresist film 120. The exposure process may be performed using an electron beam (e-beam) exposure system, an extreme ultraviolet (EUV) exposure system, a 248-nm KrF excimer laser exposure system, a 193-nm ArF excimer laser exposure system, a 365-nm i-line exposure system, and so forth.

When fine patterns (e.g., a plurality of contact hole patterns having a width of several tens of nm) are to be formed using the photoresist film 120 formed on the substrate 110, an EUV lithography process including an exposure process using EUV light having a wavelength of about 13.5 nm may be employed. Since the EUV lithography process is performed in a vacuum state, an EUV lithography system may not have sufficient power required to fully irradiate the photoresist film 120 along entire depth thereof along an irradiating direction. As a result, there may be a limit to sufficiently increasing a dose to generate a required amount of acid PA from the PAG included in the photoresist film 120 during the exposure process. Thus, the exposure process may be performed at a minimized dose so that the photoresist film 120 may be exposed only to a partial thickness or depth, which is less than the total thickness of the photoresist film 120, in a thickness direction of the photoresist film 120 from an exposed surface of the photoresist film 120.

After the exposure process is performed in process P14, the photoresist film 120 may be divided into an exposure region 124 and a non-exposure region 126. In the exposure region 124 of the photoresist film 120, acid PA may be generated from the PAG in the photoresist film 120. The acid PA generated by the exposure process may diffuse in the exposure region 124 to induce a deprotection reaction in a resist resin included in the photoresist film 120, thereby causing a crosslinking reaction in the resist resin.

Figure 2C:
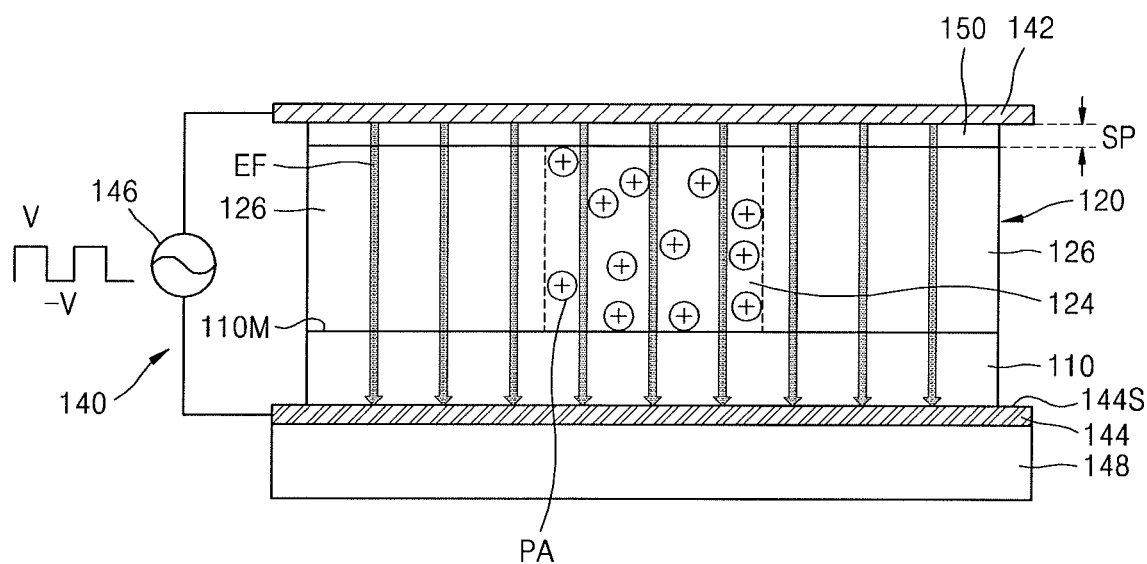

Referring to FIGS. 1 and 2C, in process P16, an electric field EF may be applied to the photoresist film 120 using an electric-field application device 140 in a direction perpendicular to a direction in which the main surface 110M of the substrate 110 extends, e.g., along the irradiation direction, so that acid PA may be further diffused in the exposure region 124 of the photoresist film 120.

The electric-field application device 140 may include a first electrode 142, a second electrode 144, and a power source 146, connected to the first electrode 142 and the second electrode 144, to apply an electric field between the first electrode 142 and the second electrode 144. The second electrode 144 may have a support surface 144S to support the substrate 110.

When the electric field EF is applied to the photoresist film 120 using the electric-field application device 140, the electric field EF may be applied to the photoresist film 120 through an electric-field transmission layer 150 that fills a space between the photoresist film 120 and the first electrode 142. In some embodiments, during the application of the electric field EF to the photoresist film 120, the electric-field transmission layer 150 may be in contact, e.g., direct contact, with each of the photoresist film 120 and the first electrode 142. That is, while a bottom surface of the electric-field transmission layer 150 is in contact, e.g., direct contact, with the photoresist film 120 and a top surface of the electric-field transmission layer 150 is in contact, e.g., direct contact, with the first electrode 142, the electric field EF may be applied to the photoresist film 120 using the electric-field application device 140.

The electric-field application device 140 may further include a heater 148 to apply heat through the second electrode 144 to the substrate 110. In process P16 of FIG. 1, while acid PA is being diffused in the exposure region 124 of the photoresist film 120 by applying the electric field EF to the photoresist film 120 using the electric-field application device 140, a post-exposure baking (PEB) process of applying heat to the substrate 110 using the heater 148 may be performed. In some embodiments, the PEB process may be performed at a temperature of about 80° C. to about 130° C. for about 40 seconds to about 100 seconds.

In some embodiments, the electric-field transmission layer 150 may include an ion-containing layer. The ion-containing layer may include ion water or an ion gel pattern.

When the electric-field transmission layer 150 includes ion water, the ion water may include water and ions, which are obtained from sodium chloride (NaCl), potassium chloride (KCl), lithium chloride (LiCl), sodium nitrate (NaNO$_3$), tetramethylammonium chloride (C$_4$H$_{12}$NCl), and so forth.

Figure 3:
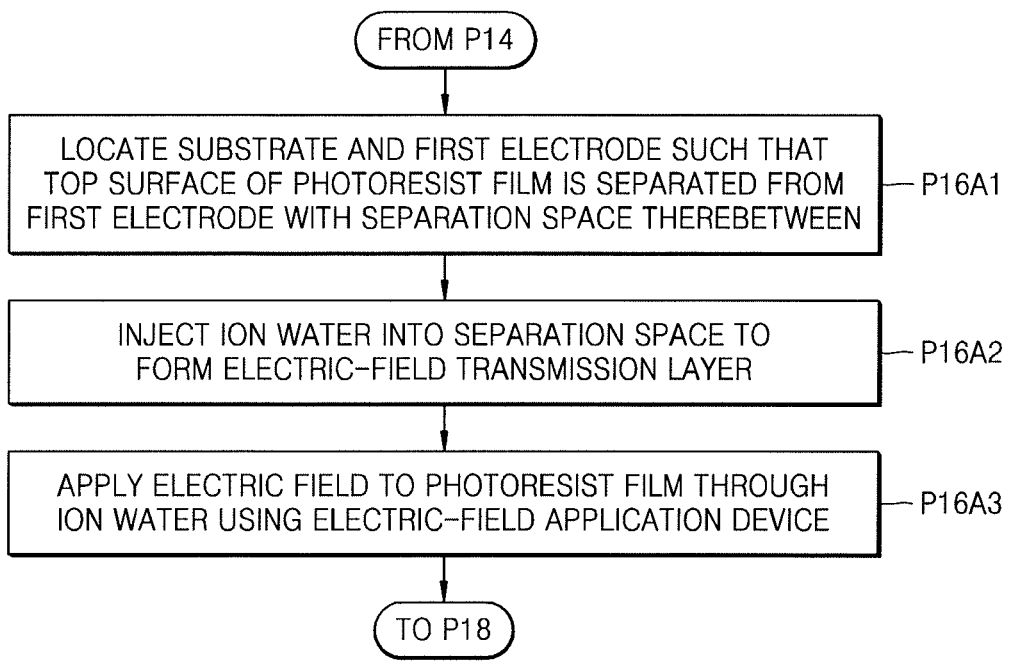
FIG. 3 illustrates a flowchart of a method of manufacturing an IC device, according to embodiments, when an electric-field transmission layer includes ion water.

FIG. 3 is a flowchart of a process of diffusing acid PA in an exposure region 124 of a photoresist film 120 by applying an electric field EF to the photoresist film 120 using an electric-field application device 140 according to process P16 of FIG. 1, when an electric-field transmission layer 150 includes ion water. Referring to FIGS. 2C and 3, in process P16A1, a substrate 110 and a first electrode 142 may be located, e.g., arranged, so that a top surface of the photoresist film 120, e.g., a surface opposite to the main surface 110M of the substrate 110, may be spaced apart from the first electrode 142 with a separation space SP therebetween.

In some embodiments, the separation space SP between the top surface of the photoresist film 120 and the first electrode 142 may have a height of about 0.2 μm to about 10 μm. While the substrate 110 is being supported on the second electrode 144, the first electrode 142 and/or the second electrode 144 may be moved up and down to control heights of the first electrode 142 and/or the second electrode 144, e.g., to control the height of the separation space SP. Thus, the photoresist film 120 and the first electrode 142 may be located, e.g., arranged, so that the top surface of the photoresist film 120 may face the first electrode 142 with the separation space SP having a desired height therebetween.

In process P16A2, ion water may be injected into the separation space SP to form the electric-field transmission layer 150. In some embodiments, capillarity may be used to inject ion water into the separation space SP.

In process P16A3, an electric field EF may be applied to the photoresist film 120 through the electric-field transmission layer 150 including ion water using the electric-field application device 140.

As described in process P16 of FIG. 1 and process P16A3 of FIG. 3, during the application of the electric field EF to the photoresist film 120 using the electric-field application device 140, a PEB process may be performed using the heater 148. During the PEB process, a temperature of the electric-field transmission layer 150 may increase.

In a comparative example, if the separation space SP is filled with deionized water (DIW), when an electric field EF is applied to the photoresist film 120 through the DIW using the electric-field application device 140, a temperature of the DIW may be increased. A boiling point of DIW may be lower than that of ion water. Accordingly, when DIW is used, bubbling may start at a relatively low temperature as compared to when ion water is used, and the photoresist film 120 may be damaged by the bubbling of the DIW.

In contrast, when a PEB process is performed while applying an electric field EF to the photoresist film 120 using the electric-field transmission layer 150 including ion water, damage of the photoresist film 120 due to bubbling may be inhibited as compared to the case of using DIW.

Referring back to FIG. 1, in process P16, when an electric field EF is applied to the photoresist film 120 using the electric-field application device 140, the electric-field transmission layer 150 may include an ion-containing layer, and the ion-containing layer may include an ion gel pattern. In some embodiments, the ion gel pattern may include a gel pattern including organic amine cations and counter anions.

Figure 4:
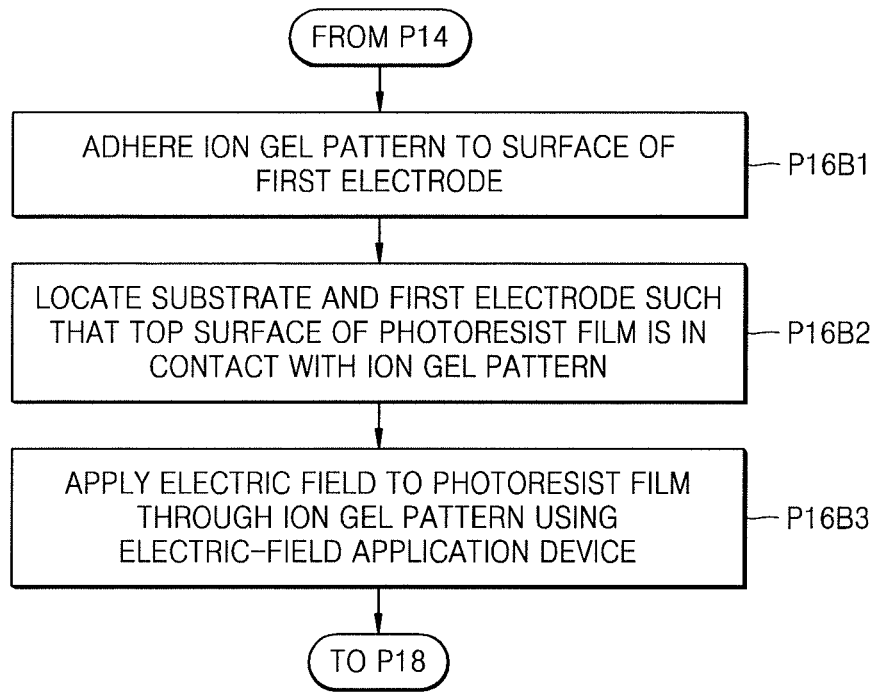
FIG. 4 illustrates a flowchart of a method of manufacturing an IC device, according to embodiments, when an electric-field transmission layer includes an ion gel pattern.

FIG. 4 is a flowchart of a process of diffusing acid PA in an exposure region 124 of a photoresist film 120 by applying an electric field EF to the photoresist film 120 using an electric-field application device 140 according to process P16 of FIG. 1, when the electric-field transmission layer 150 includes an ion gel pattern. Referring to FIGS. 2C and 4, in process P16B1, an ion gel pattern may be adhered to a surface of a first electrode 142, which faces a second electrode 144. Alternatively, the electric-field transmission layer 150 including an ion gel pattern may be adhered to the top surface of the photoresist film 120. In some embodiments, the ion gel pattern included in the electric-field transmission layer 150 may have a thickness of about 0.2 μm to about 400 μm.

In some embodiments, organic amine cations that may be included in the ion gel pattern that constitutes the electric-field transmission layer 150 may be 1-ethyl-3-methylimidazolium (EMI) cations or 1-propyl-3-methylimidazolium (PMI) cations. The counter anions included in the ion-containing layer may be bromide (Br$^-$), tetrafluoroborate (BF$_4^-$), or bis(trifluoromethylsulfonyl)amide (N$^-$(SO$_2$CF$_3$)$_2$). Various ions may be used as the organic amine cations and the counter anions that may be included in the ion gel pattern.

In some embodiments, to form the ion gel pattern, the organic amine cations and the counter anions may be dissolved in an organic solvent (e.g., acetone) to prepare an ionic liquid. A liquid obtained by dissolving vinyl monomers in the ionic liquid may be applied onto a flat casting substrate, and the vinyl monomers contained in the ionic liquid may undergo in-situ radical-polymerization. The vinyl monomers may include methyl acrylate or methyl methacrylate. For example, the radical polymerization may be performed in the presence of benzoyl peroxide (BPO) at a temperature of about 80° C. for about 12 hours. After the radical polymerization, a thermal treatment may be performed at a temperature of about 140° C. for about 30 minutes to form a polymer membrane including a combination of ions and polymer gel. Thereafter, the polymer membrane may be patterned in a desired shape and used as the electric-field transmission layer 150.

In some other embodiments, to form the ion gel pattern, to begin with, 1-ethyl-3-methylimidazolium bis(trifluoromethylsulfonyl)imide, which is an ionic liquid, and poly (vinylidene fluoride-co-haxafluoropropylene), which is a network-forming polymer, may be dissolved in an organic solvent (e.g., acetone) to prepare ion gel ink. The prepared ion gel ink may be dropped onto a casting substrate and then dried in the air for about 24 hours to remove the organic solvent, thereby preparing an ion gel film. Thereafter, the ion gel film may be formed into a desired shape or pattern, e.g., using a blade.

In some other embodiments, to form the ion gel pattern, to begin with, 1-ethyl-3-methylimidazolium bis(trifluoromethylsulfonyl)imide, which is an ionic liquid, may be mixed with poly(ethylene glycol) diacrylate and 2-hydroxyl-2-methylpropiophenone, which is an initiator, to prepare photosensitive ink. Thereafter, the prepared photosensitive ink may be dropped onto a casting substrate and cast, and crosslinked with a polymer with the application of ultraviolet (UV) light to prepare an ion gel film. The ion gel film may be formed into a desired shape or pattern, e.g., cut using a blade. Afterwards, the ion gel film may be moved from the casting substrate to a desired position, e.g., using tweezers.

Referring back to FIGS. 2C and 4, in process P16B2, the substrate 110 and the first electrode 142 may be located so that the top surface of the photoresist film 120 may be in contact, e.g., in direct contact, with the electric-field transmission layer 150 including the ion gel pattern. To this end, a position of the first electrode 142 and/or the second electrode 144 may be adjusted by moving the first electrode 142 and/or the second electrode 144 up and down. A bottom surface of the electric-field transmission layer 150 may be in contact, e.g., direct contact, with the top surface of the photoresist film 120, while a top surface of the electric-field transmission layer 150 may be in contact, e.g., direct contact, with the first electrode 142.

In process P16B3, an electric field EF may be applied to the photoresist film 120 through the electric-field transmission layer 150 including the ion gel pattern using the electric-field application device 140. As described in process P16 of FIG. 1, a PEB process may be performed using the heater 148 during the application of the electric field to the photoresist film 120 using the electric-field application device 140.

In some other embodiments, when the electric field EF is applied to the photoresist film 120 using the electric-field application device 140 in process P16 of FIG. 1, the electric-field transmission layer 150 may include a conductive polymer layer.

Although the conductive polymer layer may include aromatic heterocyclic polyimide, linear polyimide, polyacetylene, poly(p-phenylene) (PPP), polythiophene, poly(ethylene dioxythiophene) (PEDOT), polypyrrole (PPy), poly(p-phenylene vinylene) (PPV), poly(thienylene vinylene) (PTV), polyaniline (PANi), polyisothianaphthene (PITN), poly(p-phenylene sulfide)) (PPS), and a combination thereof, kinds of a conductive polymer layer that may be used in a method of manufacturing an IC device, according to an embodiment.

Figure 5:
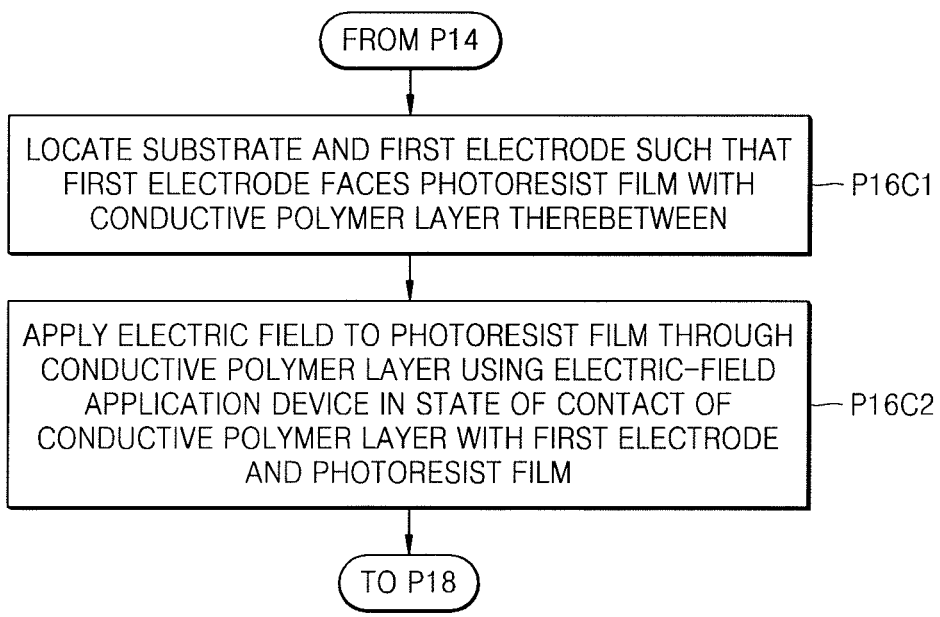
FIG. 5 illustrates a flowchart of a method of manufacturing an IC device, according to embodiments, when an electric-field transmission layer includes a conductive polymer layer.

FIG. 5 is a flowchart of a process of diffusing acid PA in an exposure region 124 of a photoresist film 120 by applying an electric field EF to the photoresist film 120 using an electric-field application device 140 according to process P16 of FIG. 1 when the electric-field transmission layer 150 includes a conductive polymer layer.

Referring to FIGS. 2C and 5, in process P16C1, the substrate 110 and the first electrode 142 may be located so that the first electrode 142 faces the photoresist film 120 with the electric-field transmission layer 150 including the conductive polymer layer therebetween. In some embodiments, the electric-field transmission layer 150 including the conductive polymer layer may be formed on the photoresist film 120 after process P12 of FIG. 1 is performed and before process P14 is performed. In some other embodiments, the electric-field transmission layer 150 including the conductive polymer layer may be formed on the photoresist film 120 after process P14 of FIG. 1 is performed. In some other embodiments, the electric-field transmission layer 150 including the conductive polymer layer may be formed on the first electrode 142.

In process P16C2, while the electric-field transmission layer 150 including the conductive polymer layer is between the first electrode 142 and the photoresist film 120, and is in contact, e.g., direct contact, with each of the first electrode 142 and the photoresist film 120, an electric field EF may be applied to the photoresist film 120 through the electric-field transmission layer 150 including the conductive polymer layer using the electric-field application device 140.

FIG. 2C illustrates an example in which a waveform of an output voltage output by a power source 146 is a rectangular wave having a peak voltage V/−V. Alternatively, a direct-current (DC) voltage may be output from the power source 146. In some embodiments, an electric field EF of about 1 Hz to about 10 KHz may be applied between the first electrode 142 and a second electrode 144 through the power source 146.

As shown in FIG. 2C, while the substrate 110 is being supported on a support surface 144S of the second electrode 144, a separation space SP between the photoresist film 120 and the first electrode 142 may be filled with the electric-field transmission layer 150. When the electric-field transmission layer 150 is in contact, e.g., direct contact, with each of the photoresist film 120 and the first electrode 142, an electric field EF may be applied to the photoresist film 120 using the electric-field application device 140. Thus, during the application of the electric field EF to the photoresist film 120 using the electric-field application device 140, an air layer or a vacant space may not be present between the photoresist film 120 and the first electrode 142. As a result, since the photoresist film 120 is neither in contact with the first electrode 142 nor exposed to the air during the application of the electric field EF to the photoresist film 120, contamination of the top surface of the photoresist film 120 may reduce or eliminated.

During diffusion of acid PA into the exposure region 124 of the photoresist film 120 according to process P16 of FIG. 1, heat may be applied to the substrate 110 using the heater 148. The second electrode 144 may be in direct contact with a bottom surface of the substrate 110. In some other embodiments, a metal or an insulating film may be between the second electrode 144 and the substrate 110.

Each of the first electrode 142 and the second electrode 144 of the electric-field application device 140 may include a metal electrode or a transparent electrode. The metal electrode may include aluminum (Al), chromium (Cr), copper (Cu), nickel (Ni), molybdenum (Mo), or a combination thereof. The transparent electrode may include indium tin oxide (ITO). A material for the first electrode 142 may be the same as or different from a material for the second electrode 144.

After the photoresist film 120 that has undergone the exposure process according to process P14 of FIG. 1, the photoresist film 120 is provided between the first electrode 142 and the second electrode 144 of the electric-field application device 140. The separation space SP between the photoresist film 120 and the first electrode 142 is filled with the electric-field transmission layer 150, and then an electric field EF is applied to the photoresist film 120 in a thickness direction of the substrate 110, i.e., perpendicular to a direction in which a main surface 110M of the substrate 110 extends. By applying the electric field EF to the photoresist film 120 in the thickness direction of the substrate 110 as described above, a distance by which acid PA in the exposure region 124 of the photoresist film 120 moves in a vertical direction may be increased not only by the diffusion of the acid PA, but also by the drift of the acid PA due to the electric field EF. In other words, a direction in which the acid PA is diffused may be changed due to the electric field EF applied between the first electrode 142 and the second electrode 144, so that the acid PA near the top surface in the exposure region 124 of the photoresist film 120 may move toward a bottom surface of the photoresist film 120 in the exposure region 124.

Thus, the diffusion of the acid PA in a lateral direction may be inhibited, while the distance by which the acid PA is diffused in the vertical direction may increase. Accordingly, even if a relatively small amount of acid PA is generated by using a relatively small dose during the exposure process to improve productivity in the exposure process, the acid PA may be actively diffused in the vertical direction over the total thickness of the exposure region 124 of the photoresist film 120. Thus, a deprotection reaction of a resist resin may actively occur over the total thickness of the photoresist film 120. As a result, after a subsequent developing process (e.g., a developing process shown in process P18 of FIG. 1) is performed, a photoresist pattern having a good vertical sidewall profile may be obtained.

An electric field EF may be applied to the photoresist film 120 while a bottom surface of the electric-field transmission layer 150 is in contact, e.g., direct contact, with a top surface of the photoresist film 120 and a top surface of the electric-field transmission layer 150 is in contact, e.g., direct contact, with a bottom surface of the first electrode 142 that faces the photoresist film 120. Thus, the photoresist film 120 may not be in contact with the first electrode 142 or exposed to a process atmosphere, e.g., air, during the application of the electric field EF to the photoresist film 120. Accordingly, the top surface of the photoresist film 120 may not be contaminated by the first electrode 142 or the process atmosphere, and the electric field EF may be effectively transmitted from the first electrode 142 to the photoresist film 120.

In some embodiments, to apply an electric field EF to the photoresist film 120 according to process P16 of FIG. 1, a high-frequency electric field of about 300 MHz or higher may be applied between the first electrode 142 and the second electrode 144.

In some embodiments, additional heat for facilitating the diffusion of acid PA and a deprotection reaction of a resist resin may not be supplied to the substrate 110. In this case, vertical movement of acid PA and the deprotection reaction of the resist resin may be facilitated due to activation energy supplied to the photoresist film 120 by a high-frequency electric field using the electric-field application device 140. Accordingly, even if the heater 148 is not used, the PEB process may be performed using a method of applying a high-frequency electric field between the first electrode 142 and the second electrode 144.

In process P16 of FIG. 1, an electric field EF that is applied in a direction perpendicular to a direction in which the main surface 110M of the substrate 110 extends may be used to diffuse acid PA generated by an exposure process. Therefore, diffusion of acid PA in the exposure region 124 in a lateral direction, e.g., towards regions outside the exposure region, may be inhibited by the drift of the acid PA present in the exposure region 124 due to the electric field EF. A distance by which the acid PA moves in a vertical direction corresponding to a thickness direction of the substrate 110 may increase according to a direction of the electric field EF. Thus, the acid PA may be actively diffused in the vertical direction over the total thickness of the photoresist film 120 and actively moved to a bottom surface of the photoresist film 120 in the exposure region 124. Therefore, resolution may be increased, a dimension precision of a pattern to be formed on the substrate 110 may be improved, and critical dimension (CD) uniformity may be enhanced. In some embodiments, an acid diffusion process according to process P16 of FIG. 1 may be performed for about 1 second to about 90 seconds.

Figure 2D:
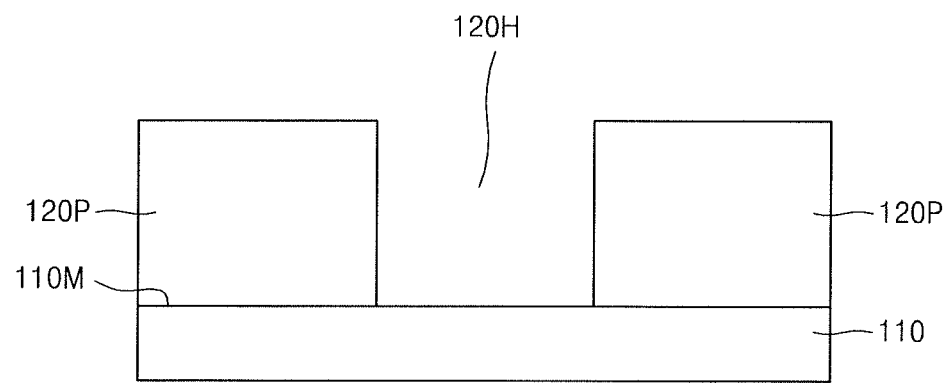

Referring to FIGS. 1 and 2D, in process P18, the photoresist film 120 may be developed to form a photoresist pattern 120P having an opening 120H. To develop the photoresist film 120, an alkaline developer, for example, 2.38% by weight of a tetramethylammonium hydroxide (TMAH) developer may be used. When necessary, after the photoresist film 120 is developed, the photoresist pattern 120P may be removed, e.g., rinsed using DIW.

In some embodiments, when the electric-field transmission layer 150 includes ion water or a conductive polymer layer, during the developing of the photoresist film 120, the electric-field transmission layer 150 remaining on the photoresist film 120 may be easily removed together with the exposure region 124 of the photoresist film 120 by the developer. In some other embodiments, when the electric-field transmission layer 150 includes an ion gel pattern, after process P16 of FIG. 1 is performed, before the photoresist film 120 is developed in process P18 of FIG. 1, a process of separating the ion gel pattern from the top surface of the photoresist film 120 may be further performed.

Figure 6:
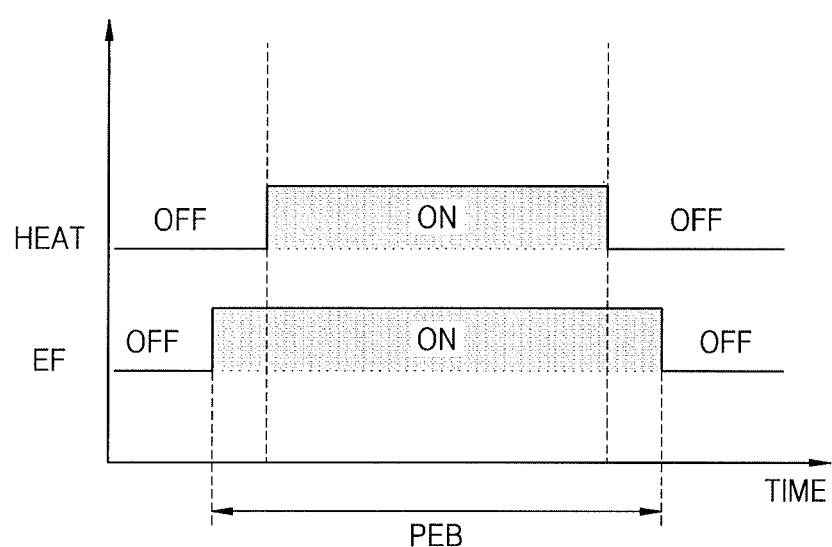
FIG. 6 illustrates a timing diagram showing on/off time points of an electric-field application process and a heat application process in a method of manufacturing an IC device according to embodiments.

FIG. 6 is a timing diagram showing on/off time points of an electric-field (EF) application process for the diffusion of acid PA and a heat application process using the heater 148 when the acid PA is diffused in the exposure region 124 of a photoresist film 120 by applying the electric field EF to the photoresist film 120 using an electric-field application device 140 as described in process P16 with reference to FIGS. 1 and 2C in a method of manufacturing an IC device according to embodiments.

When the electric-field (EF) application process for the diffusion of the acid PA and the PEB process are performed as in process P16 of FIG. 1, the timing shown in FIG. 6 may be used to minimize the diffusion of acid generated by an exposure process in a lateral direction and to increase a distance by which the generated acid moves in a vertical direction.

The process will now be described in further detail with reference to FIGS. 2C and 6. When the PEB process is initialized, an electric field EF may be firstly applied to the photoresist film 120 by turning on (ON) the power source 146 of the electric-field application device 140. Thereafter, heat may be transmitted to a substrate 110 by turning on (ON) the heater 148 during the application of the electric field EF to the photoresist film 120.

When the PEB process is terminated, the heater 148 may be turned off (OFF) during the application of the electric field EF to the photoresist film 120, thereby blocking heat transmitted from the heater 148 to the substrate 110. After the heater 148 is turned off (OFF), the power source 146 of the electric-field application device 140 may be turned off to stop the application of the electric field EF to the photoresist film 120.

In the PEB process, as shown in FIG. 6, before turning on (ON) the heater 148, an electric field EF may be firstly applied to the photoresist film 120 by turning on (ON) the power source 146. In addition, before the application of the electric field EF to the photoresist film 120 is stopped by turning off (OFF) the power source 146, heat supplied to the substrate 110 may be halted by turning off (OFF) the heater 148. Therefore, before the electric filed EF is applied and after the application of the electric field EF is terminated, the diffusion of acid in the photoresist film 120 in an undesired direction due to heat generated by the heater 148 may be prevented. In other words, heating using the heater 148 alone may result in the diffusion of acid in a lateral direction. Accordingly, a dimension precision of a pattern to be formed on the substrate 110 may be improved, and CD uniformity may be enhanced.

Figure 7:
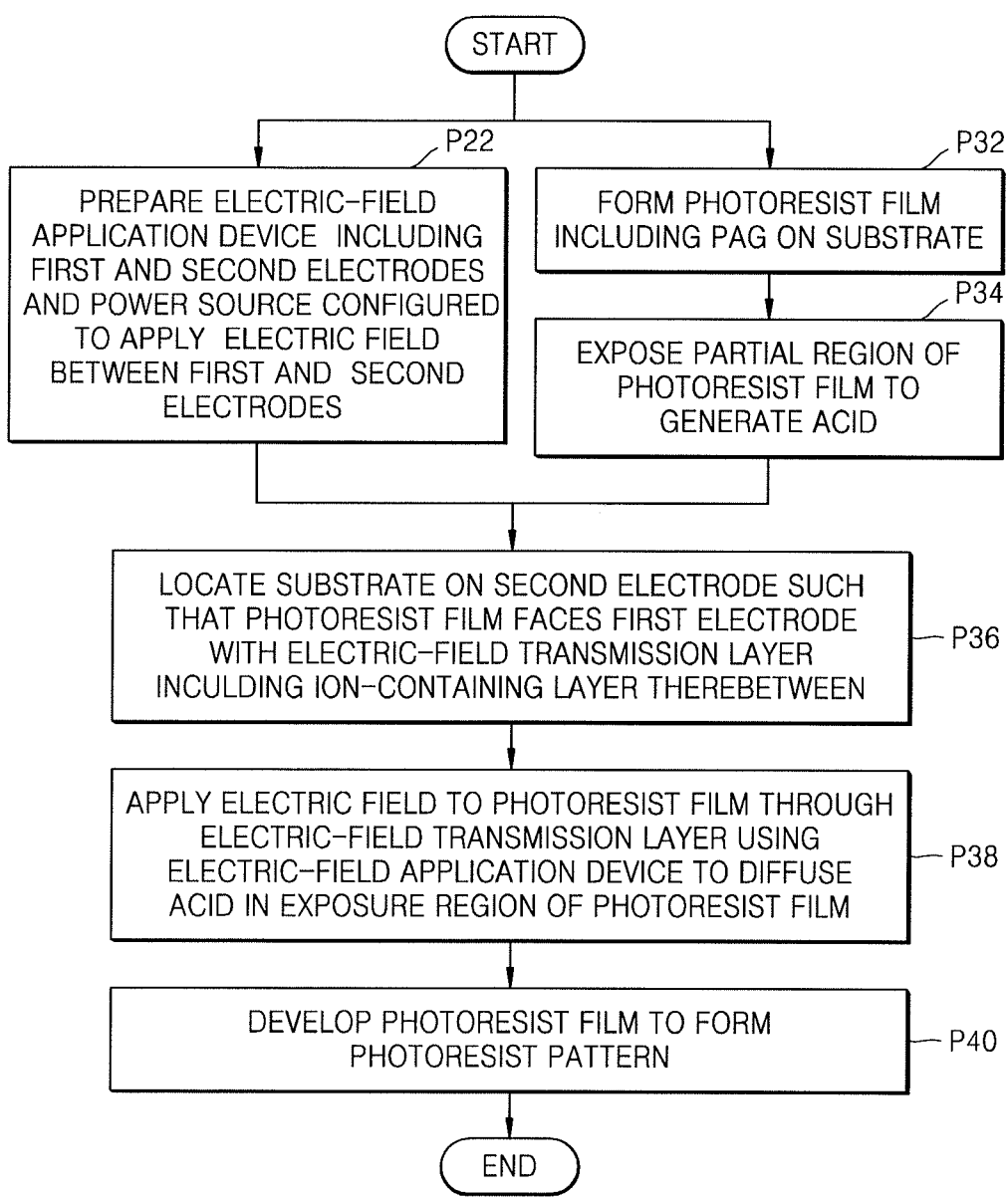
FIG. 7 illustrates a flowchart of a method of manufacturing an IC device, according to other embodiments.

FIG. 7 is a flowchart of a method of manufacturing an IC device, according to other embodiments. In describing the method of manufacturing the IC device shown in FIG. 7, the same reference numerals are used to denote the same elements as in FIGS. 1 to 6, and repeated descriptions thereof will be omitted.

Referring to FIG. 7, in process P22, the electric-field application device 140 shown in FIG. 2C may be prepared. Referring to FIGS. 2A and 7, in process P32, the photoresist film 120 including a PAG may be formed on a substrate 110 using a method similar to that described in process P12 with reference to FIGS. 1 and 2A. Referring to FIGS. 2B and 7, in process P34, by using a method similar to that described in process P14 with reference to FIGS. 1 and 2B, a partial region of the photoresist film 120 may be exposed so that acid may be generated from an exposure region 124 of the photoresist film 120.

Referring to FIGS. 2C and 7, in process P36, the substrate 110 may be located on a second electrode 144 so that the photoresist film 120 may face a first electrode 142 with an electric-field transmission layer 150 including an ion-containing layer therebetween. As described with reference to FIGS. 1 and 2C, the ion-containing layer may include ion water or an ion gel pattern.

When the electric-field transmission layer 150 includes ion water, after the substrate 110 is located on the second electrode 144 such that the photoresist film 120 faces the first electrode 142, the ion water may be injected using capillarity into a separation space SP between a top surface of the photoresist film 120 and a bottom surface of the first electrode 142.

When the electric-field transmission layer 150 includes an ion gel pattern, before the substrate 110 is located on the second electrode 144 such that the photoresist film 120 faces the first electrode 142, the ion gel pattern may be adhered to a bottom surface of the first electrode 142 facing the photoresist film 120. Thereafter, while the substrate 110 is being supported on the second electrode 144, the first electrode 142 and/or the second electrode 144 may be moved up and down. Thus, heights of the first electrode 142 and/or the second electrode 144 may be controlled so that the photoresist film 120 may be in contact, e.g., direct contact, with the ion gel pattern. Alternatively, the ion gel pattern may be provided on the photoresist film 120, and the first electrode 142 and/or the second electrode 144 may be moved up and down so that the bottom surface of the first electrode 142 may be in contact, e.g., direct contact, with the ion gel pattern.

Referring to FIGS. 2C and 7, in process P38, an electric field EF may be applied to the photoresist film 120 through the electric-field transmission layer 150 including the ion-containing layer in a direction perpendicular to a direction in which a main surface 110M of the substrate 110 extends, using the electric-field application device 140 so that acid PA may be diffused in the exposure region 124 of the photoresist film 120.

As shown in FIG. 2C, the electric-field application device 140 may further include a heater 148 to apply heat to the substrate 110 through the second electrode 144. In this case, during the application of the electric field EF to the photoresist film 120, heat may be applied to the substrate 110 using the heater 148.

Referring to FIGS. 2D and 7, in process P40, by using the same method as described in process P18 with reference to FIGS. 1 and 2D, the photoresist film 120 may be developed to form a photoresist pattern 120P having an opening 120H.

Figure 8:
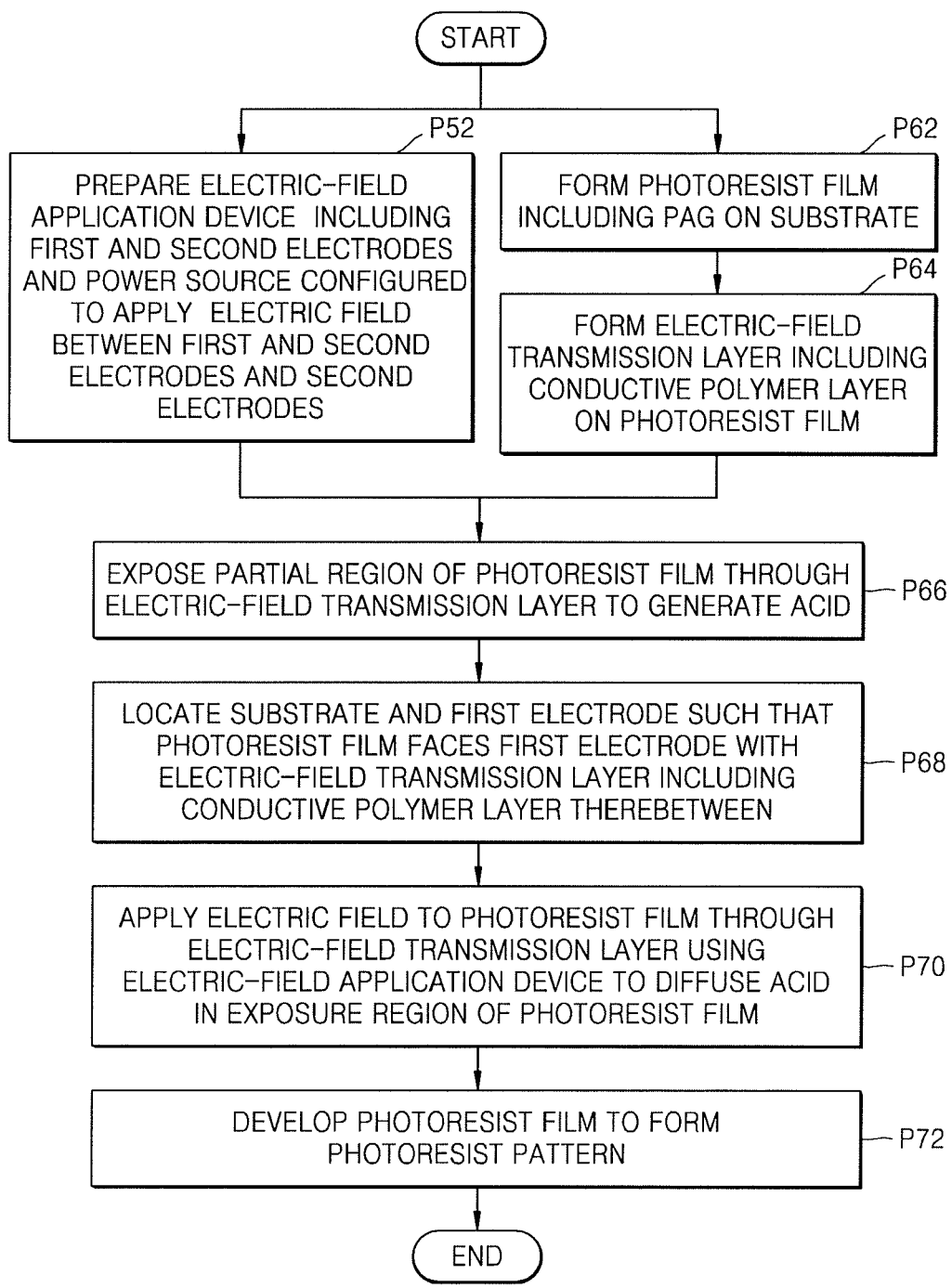
FIG. 8 illustrates a flowchart of a method of manufacturing an IC device, according to other embodiments.
Figure 9A:
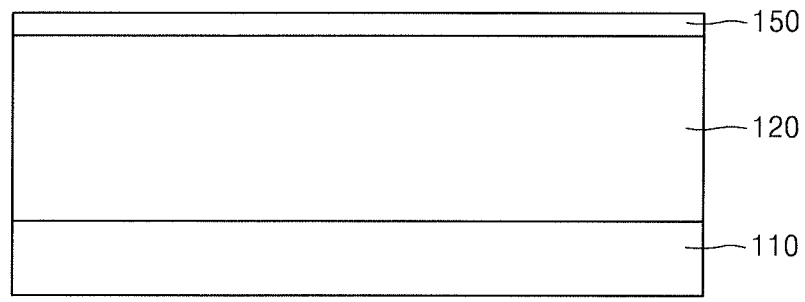
FIGS. 9A and 9B illustrate cross-sectional views of some stages in the method of manufacturing the IC device shown in FIG. 8.
Figure 9B:
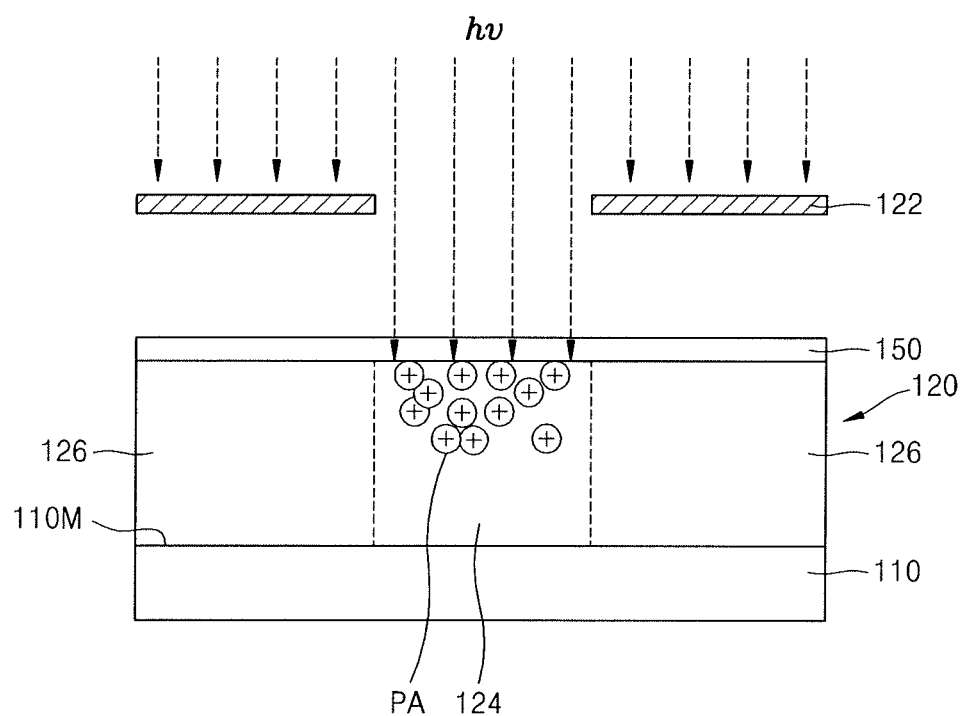

FIG. 8 is a flowchart of a method of manufacturing an IC device, according to other embodiments. FIGS. 9A and 9B are cross-sectional views of some processes of the method of manufacturing the IC device shown in FIG. 8. In describing the method of manufacturing the IC device shown in FIG. 8, the same reference numerals are used to denote the same elements as in FIGS. 1 to 6, and repeated descriptions thereof will be omitted.

Referring to FIG. 8, in process P52, an electric-field application device 140 shown in FIG. 2C may be prepared. Referring to FIGS. 2A and 8, in process P62, a photoresist film 120 including a PAG may be formed on a substrate 110 using a method similar to that described in process P12.

Referring to FIGS. 8 and 9A, in process P64, an electric-field transmission layer 150 including a conductive polymer layer may be formed on the photoresist film 120. To form the electric-field transmission layer 150 including the conductive polymer layer, the photoresist film 120 may be coated with a solvent in which a conductive polymer is dispersed, and the solvent may be volatilized, e.g., using a bake process. The solvent may be an aqueous solvent or an organic solvent. Alternatively, the conductive polymer layer may be formed on the first electrode 142.

Referring to FIGS. 8 and 9B, in process P66, by using a method similar to that described in process P14 with reference to FIGS. 1 and 2B, a partial region of the photoresist film 120 may be exposed through the electric-field transmission layer 150 including the conductive polymer layer so that acid PA may be generated in an exposure region 124 of the photoresist film 120. In other words, in the process of FIG. 8, the electric-field transmission layer 150 is formed before the photoresist film 120 is exposed. Alternatively, the electric-field transmission layer 150 may be formed on the photoresist film 120 after the photoresist film is exposed.

Referring to FIGS. 2C and 8, in process P68, by using the same method as described in process P16C1 of FIG. 5, the substrate 110 and a first electrode 142 may be located so that the photoresist film 120 may face the first electrode 142 with the electric-field transmission layer 150 including a conductive polymer layer therebetween.

Referring to FIGS. 2C and 8, in process P70, by using the same method as described in process P16C2 of FIG. 5, while the electric-field transmission layer 150 including the conductive polymer layer is being interposed between the first electrode 142 and the photoresist film 120 in contact with each of the first electrode 142 and the photoresist film 120, an electric field EF may be applied to the photoresist film 120 through the conductive polymer layer using the electric-field application device 140 in a direction perpendicular to a direction in which a main surface 100M of the substrate 110 extends, so acid PA may be diffused in the exposure region 124 of the photoresist film 120.

As shown in FIG. 2C, the electric-field application device 140 may further include a heater 148 configured to apply heat to the substrate 110 through a second electrode 144. In this case, during the application of the electric field EF to the photoresist film 120, heat may be applied to the substrate 110 using the heater 148.

Referring to FIGS. 2D and 8, in process P72, by using the same method as described in process P18 with reference to FIGS. 1 and 2D, the photoresist film 120 may be developed to form a photoresist pattern 120P having an opening 120H.

In the method of manufacturing the IC device, according to the embodiments, which are described with reference to FIGS. 1 to 9B, during a photolithography process, an electric field EF may be applied in the direction perpendicular to the main surface 110M of the substrate 110 so that acid PA may be prevented from diffusing in the photoresist film 120 in a lateral direction and a distance by which the acid PA moves in a vertical direction may be increased. In this case, the electric field EF may be applied to the photoresist film 120 using the electric-field transmission layer 150. During the application of the electric field EF to the photoresist film 120 using the electric-field transmission layer 150, damage of the photoresist film 120 may be inhibited. Also, during the application of the electric field EF to the photoresist film 120, the photoresist film 120 may be unlikely to contact the first electrode 142 or be exposed to a process atmosphere, e.g., air. Therefore, the electric field EF may be effectively transmitted from the first electrode 142 to the photoresist film 120 without anxiety for contamination of a top surface of the photoresist film 120 by the first electrode 142 or the process atmosphere.

One or more embodiments provide a method of manufacturing an integrated circuit (IC) device, by which a photoresist pattern having an improved resolution and a uniform critical dimension (CD) distribution may be obtained while ensuring productivity in a photolithography process using a simplified process. One or more embodiments may include an electric-field transmission layer between an electrode and a photoresist film facing each other. The electric-field transmission layer may be in contact, e.g., in direct contact with surfaces of the electrode and the photoresist film facing each other.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an integrated circuit device, the method comprising:
   forming a photoresist film on a main surface of a substrate, the photoresist film including a photoacid generator (PAG);
   exposing a first region of the photoresist film to generate acid in the first region of the photoresist film;
   diffusing the acid in the first region of the photoresist film by applying an electric field, in a direction perpendicular to a direction in which the main surface of the substrate extends, to the photoresist film through an electric-field transmission layer between the photoresist film and an electrode facing the main surface of the substrate; and
   forming a photoresist pattern by developing the photoresist film,
   wherein:
   the electric-field transmission layer includes ion water or an ion gel pattern,
   the ion water includes water and ions obtained from sodium chloride, potassium chloride, lithium chloride, sodium nitrate, or tetramethylammonium chloride, and
   the ion gel pattern includes organic amine cations and counter anions.

2. The method as claimed in claim 1, wherein diffusing the acid includes contacting each of the photoresist film and the electrode with the electric-field transmission layer before applying the electric field.

3. The method as claimed in claim 1, wherein:
   the electric-field transmission layer includes the ion water.

4. The method as claimed in claim 1, wherein diffusing the acid includes:
   arranging the substrate and the electrode such that a top surface of the photoresist film is separated from the electrode with a separation space therebetween;
   injecting the ion water into the separation space to form the electric-field transmission layer; and
   applying an electric field to the photoresist film through the ion water.

5. The method as claimed in claim 1, wherein:
   the electric-field transmission layer includes the ion gel pattern.

6. The method as claimed in claim 1, wherein diffusing the acid includes;
   providing the ion gel pattern as the electric-field transmission layer between the electrode and the photoresist film;
   arranging the substrate and the electrode such that each of photoresist film and the electrode is in contact with the ion gel pattern; and
   applying an electric field to the photoresist film through the ion gel pattern.

7. The method as claimed in claim 1, wherein diffusing the acid further includes heating the substrate during applying the electric field.

8. A method of manufacturing an integrated circuit device, the method comprising:
   preparing a first electrode, a second electrode, and a power source connected to the first electrode and the second electrode, the power source to apply an electric field between the first electrode and the second electrode;
   forming a photoresist film on a main surface of a substrate, the photoresist film including a photoacid generator (PAG);
   exposing a first region of the photoresist film to generate acid in the first region of the photoresist film;
   arranging the substrate such that the photoresist film faces the first electrode with an electric-field transmission layer including an ion-containing layer therebetween;
   diffusing the acid in the first region of the photoresist film by applying an electric field, in a direction perpendicular to a direction in which the main surface of the substrate extends, to the photoresist film through the electric-field transmission layer; and
   forming a photoresist pattern by developing the photoresist film,
   wherein the electric-field transmission layer includes:
   ions obtained from sodium chloride, potassium chloride, lithium chloride, sodium nitrate, or tetramethylammonium chloride, or
   imidazolium cations and bromide, tetrafluoroborate, or bis(trifluoromethylsulfonyl)amide anions.

9. The method as claimed in claim 8, wherein diffusing the acid further includes applying heat to the substrate.

10. A method of manufacturing an integrated circuit device, the method comprising:
    preparing a first electrode, a second electrode, and a power source connected to the first electrode and the second electrode, the power source to apply an electric field between the first electrode and the second electrode;
    forming a photoresist film including a photoacid generator (PAG) on a main surface of a substrate;

forming an electric-field transmission layer on the photoresist film, the electric-field transmission layer including a conductive polymer layer;

exposing a first region of the photoresist film through the electric-field transmission layer to generate acid in the first region of the photoresist film;

arranging the substrate such that the photoresist film faces the first electrode with the electric-field transmission layer therebetween;

diffusing the acid in the first region of the photoresist film by applying an electric field, in a direction perpendicular to a direction in which the main surface of the substrate extends, to the photoresist film through the electric-field transmission layer; and forming a photoresist pattern by developing the photoresist film, wherein the electric-field transmission layer includes an aromatic heterocyclic polyimide, a linear polyimide, polyacetylene, poly(p-phenylene), polythiophene, poly(ethylene dioxythiophene), polypyrrole, poly(p-phenylene vinylene), poly(thienylene vinylene), polyaniline, polyisothianaphthene, poly(p-phenylene sulfide), or a combination thereof.

11. The method as claimed in claim 10, wherein the diffusing the acid further includes heating the substrate.

12. The method as claimed in claim 10, wherein diffusing the acid includes bringing the electric-field transmission layer and the first electrode into contact.

13. The method as claimed in claim 10, wherein forming the photoresist pattern includes removing the electric-field transmission layer.

* * * * *

UNITED STATES PATENT AND TRADEMARK OFFICE
CERTIFICATE OF CORRECTION

PATENT NO. : 10,795,262 B2  
APPLICATION NO. : 16/165567  
DATED : October 6, 2020  
INVENTOR(S) : Jin Park et al.

Page 1 of 1

It is certified that error appears in the above-identified patent and that said Letters Patent is hereby corrected as shown below:

On the Title Page

Item (73), should read:  
(73) Assignees: SAMSUNG ELECTRONICS CO., LTD.,  
Suwon-si, Gyeonggi-do (KR);  
Research & Business Foundation  
SUNGKYUNKWAN UNIVERSITY  
Suwon, Gyeonggi-do (KR)

Signed and Sealed this  
Fifth Day of October, 2021

Drew Hirshfeld  
*Performing the Functions and Duties of the*  
*Under Secretary of Commerce for Intellectual Property and*  
*Director of the United States Patent and Trademark Office*